(12) United States Patent
Hasegawa

(10) Patent No.: US 7,172,924 B2
(45) Date of Patent: Feb. 6, 2007

(54) SEMICONDUCTOR DEVICE HAVING A SEMICONDUCTOR CHIP MOUNTED ON EXTERNAL TERMINALS AND FABRICATION METHOD THEREOF

(75) Inventor: Hidenori Hasegawa, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/762,451

(22) Filed: Jan. 23, 2004

(65) Prior Publication Data

US 2005/0098859 A1    May 12, 2005

(30) Foreign Application Priority Data

Nov. 7, 2003    (JP)    ............................. 2003-378201

(51) Int. Cl.
*H01L 21/00*    (2006.01)
(52) U.S. Cl. ...................... 438/106; 438/107; 438/110; 257/687; 257/690
(58) Field of Classification Search ................ 438/106, 438/107, 110, 123, 124, 125, 126, 127; 257/687, 257/690, 692, 693, 701, 730
See application file for complete search history.

(56) References Cited

U.S. PATENT DOCUMENTS 6,462,406 B2    10/2002   Ohgiyama et al.

2002/0140079 A1*    10/2002   Takeyama ................... 257/698
2003/0015775 A1*    1/2003    Minamio et al. ........... 257/676
2003/0127711 A1*    7/2003    Kawai et al. ............... 257/666
2003/0143779 A1*    7/2003    Ochiai et al. ............... 438/124

FOREIGN PATENT DOCUMENTS

| JP | 11-330314 | 11/1999 |
|----|-----------|---------|
| JP | 2001-298144 | 10/2002 |
| JP | 2003-78076 | 3/2003 |

* cited by examiner

*Primary Examiner*—Fernando L. Toledo
(74) *Attorney, Agent, or Firm*—Wenderoth, Lind & Ponack, L.L.P.

(57) ABSTRACT

An efficient fabrication method of a SON type semiconductor device is to be provided. A plurality of linear leadframes is arranged side by side separately from each other. A plurality of semiconductor chips with a plurality of electrode pads is mounted over the plurality of the linear leadframes separately. The plurality of the electrode pads is joined to the plurality of linear leadframes with bonding wires. An encapsulation part for encapsulating the semiconductor chip and the bonding wires and an interframe encapsulation part for filling a space between the linear leadframes exposed outside the encapsulation part are formed. A groove part for cutting all the linear leadframes placed right under the semiconductor chip in the orthogonal direction with respect to the direction of extension of the linear leadframes is formed. The leadframes and the interframe encapsulation parts exposed between the plurality of semiconductor chips are cut to be separated into a semiconductor device.

10 Claims, 7 Drawing Sheets

SEMICONDUCTOR DEVICE HAVING A SEMICONDUCTOR CHIP MOUNTED ON EXTERNAL TERMINALS AND FABRICATION METHOD THEREOF

BACKGROUND OF THE INVENTION

1. Field of the Invention

The present invention relates to a semiconductor device and a fabrication method thereof, particularly to a SON (Small Outline Non-Lead Package) type semiconductor device and a fabrication method thereof.

2. Description of the Related Art

A semiconductor device is known in which an external electrode of a semiconductor chip is electrically connected to a conductor terminal with a bonding wire, and the semiconductor chip, the bonding wire and the conductor terminal are encapsulated with an insulator.

In the semiconductor device like this, a so-called SON type semiconductor device is known in which a conductor terminal is exposed from an insulator.

Furthermore, in order to reduce the exposure failure of the conductor terminal of the SON type semiconductor device like this, a fabrication process of a conductor terminal is known in which the conductor terminal is formed with the use of a conductor so that an adhesion to a substrate is reduced under a predetermined condition, and the adhesion between the substrate and the conductor terminal is reduced for removal under a predetermined condition after its encapsulation process step (for example, see Patent Document 1).

Patent Document 1 JP-A-2003-078076

In the fabrication process of the traditional SON type semiconductor device like this, a leadframe needs to be prepared so as to match the size of a semiconductor chip or the arrangement of electrode pads formed on the top surface of the semiconductor chip. In other words, a leadframe of particular specifications must be prepared for each semiconductor chip.

In addition, according to the traditional fabrication process, a dice bonding process step, a wire bonding process step, a resin encapsulation process step, and a separation process step cannot be combined into a series of process steps. Therefore, since semiconductor devices in midstream of fabrication dwell until they are processed by the subsequent process step, the time required to fabricate a semiconductor device is increased.

SUMMARY OF THE INVENTION

The invention has been made in view of the above problems. In order to solve the problems, a fabrication method of a semiconductor device according to the invention mainly includes the process steps below.

More specifically, first, a plurality of linear leadframes is arranged side by side separately from each other.

Then, a plurality of semiconductor chips having a first main surface with a plurality of electrode pads and a second main surface facing the first main surface is placed over a plurality of linear leadframes and separated from each other in the direction of extending the linear leadframes with the second main surface of each of the semiconductor chips mounted thereon.

Furthermore, the plurality of electrode pads is joined to the plurality of the linear leadframes with bonding wires.

Moreover, an encapsulation part for encapsulating the semiconductor chip and the bonding wires and an interframe encapsulation part for filling a space between the adjacent linear leadframes exposed outside the encapsulation part are formed.

Subsequently, a groove part for cutting all the linear leadframes is placed right under the second main surface in the vertical direction with respect to the direction of extending the linear leadframes.

After that, the leadframes and the interframe encapsulation parts exposed between the plurality of the semiconductor chips are cut to separate into semiconductor devices having the semiconductor chip, and a first external terminal row and a second external terminal row facing each other sandwich the groove part (i.e., face each other across a gap).

According to the fabrication method of the semiconductor device according to the invention, since the interval between the arranged leadframes is easily matched to the interval between the external terminals, leadframes do not need to be prepared for every semiconductor chip with particular specifications.

Moreover, the dice bonding process step, the wire bonding process step, the resin encapsulation process step, and the separation process step can be conducted in a series of process steps on the plurality of arranged leadframes. Therefore, the semiconductor devices in midstream of fabrication do not dwell until they are processed by the subsequent process step.

Accordingly, many semiconductor devices can be fabricated efficiently in a short time. Furthermore, the method also contributes to the reduction in the fabrication costs of the semiconductor device.

BRIEF DESCRIPTION OF THE DRAWINGS

The teachings of the invention can be readily understood by considering the following detailed description in conjunction with the accompanying drawings, in which.

DETAILED DESCRIPTION OF THE PREFERRED EMBODIMENT

Figure 1:
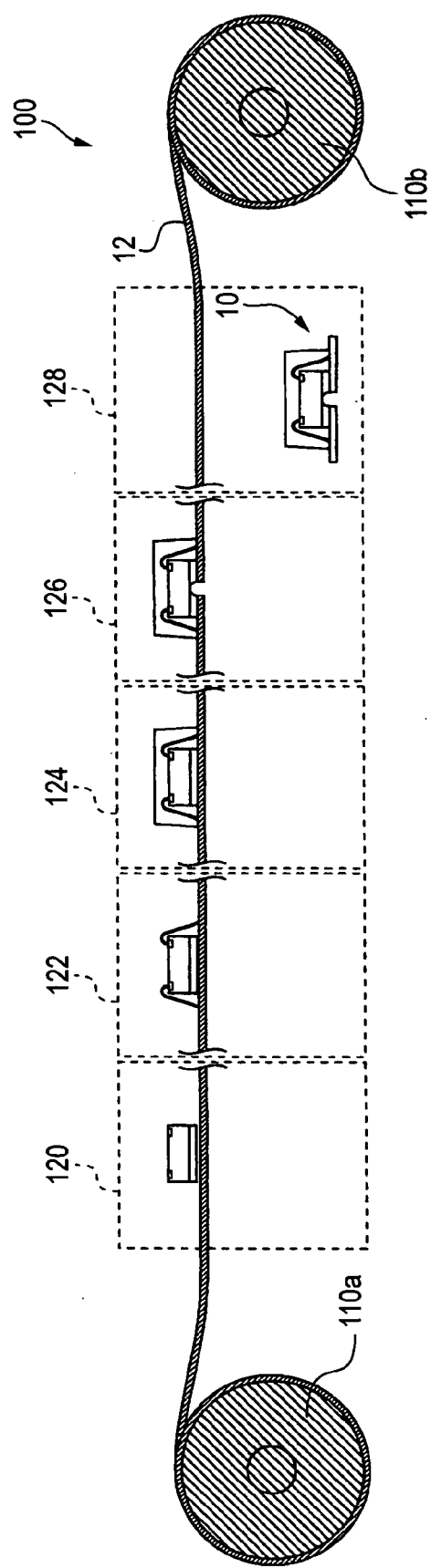
FIG. 1 is a schematic diagram for illustrating the outline of a fabrication apparatus for conducting the fabrication method of the semiconductor device according to the invention, and the outline of each of the process steps included in the fabrication method according to the invention.

Hereinafter, embodiments of the invention will be described with reference to the drawings. In addition, the shape, size and arrangement of each component are only shown schematically in the drawings so that the invention is understood, and these do not define the invention particularly. Besides, specific materials, conditions and numeric conditions are sometimes used in the description below, but they are merely preferable examples. Thus, the invention is not defined by them at all.

Moreover, the fabrication process of the semiconductor device according to the invention can be formed by traditionally well-known fabrication process steps with the use of traditionally well-known materials. Therefore, the detailed description of the traditionally well-known fabrication process steps might be omitted.

First, an overview of the fabrication method of the semiconductor device according to the invention will be described.

FIG. 1 is a schematic diagram for illustrating the outline of a fabrication apparatus 100 for conducting the fabrication method of the semiconductor device according to the invention, and illustrating the outline of each of the process steps included in the fabrication method according to the invention.

A semiconductor device according to the invention is fabricated by the fabrication apparatus 100 having first and second reels 110a and 110b separated in parallel to each other.

More specifically, the fabrication method of the semiconductor device according to the invention is characterized in that all of a dice-bonding process step 120, a wire bonding process step 122, an encapsulation process step 124, an external terminal forming process step 126, and a separation process step 128 are conducted on leadframes 12, which will be described below in detail.

Both end parts of the leadframe 12 are extended between first and second reels 110a and 110b, respectively. Furthermore, both end parts of the leadframe 12 are wound on the two first and second reels 110a and 110b in the reverse (opposite) directions to each other. A plurality of the leadframes 12 is separated from each other in stripes and extended and held between the two first and second reels 110a and 110b.

In order to prevent the misalignment of the plurality of the leadframes 12, a plurality of grooves (not shown) is preferably formed matching the interval between the leadframes 12, and the leadframes 12 are wounded in the corresponding grooves.

The dice bonding process step 120, the wire bonding process step 122, the encapsulation process step 124, the external terminal forming process step 126, and the separation process step 128 can be conducted at the same time by rotating the two first and second reels 110a and 110b in the same directions at the same time and moving them sequentially.

First, the dice bonding process step 120 of mounting first semiconductor chips on the leadframes 12 is conducted. Then, the first and second reels 110a and 110b are rotated in the same directions to move a first semiconductor chip by a predetermined distance. The dice bonding process step of mounting a second semiconductor chip on the area generated by the movement is conducted. At this time of the dice bonding process step, the first semiconductor chip moved undergoes the wire bonding process step 122. In this manner, after completion of each process step, the leadframes 12 are sequentially moved in the direction from the first reel 110a to the second reel 110b, the dice bonding process step 120, the wire bonding process step 122, the encapsulation process step 124, the external terminal forming process step 126, and the separation process step 128 are conducted at the same time.

The leadframes 12 are placed on a platen or table-shaped structure provided for the fabrication apparatus used in each of the process steps for conducting each of the process steps. Furthermore, for example, it is acceptable to conduct each of the process steps as the leadframes 12 are placed on a structure such as a platen that moves as it follows the rotations of the first and second reels 110a and 110b, that is, the movement of the leadframes 12.

Moreover, each of the process steps can be freely conducted on a preferable number of the semiconductor chips, one, two or more. In the example described below, an example in which each of the process steps is conducted as two semiconductor chips are formed as one unit will be described.

First Embodiment

Fabrication Method of the Semiconductor Device

The fabrication method of the semiconductor device of the first embodiment according to the invention will be described with reference to FIGS. 2A to 4D.

Figure 2A:
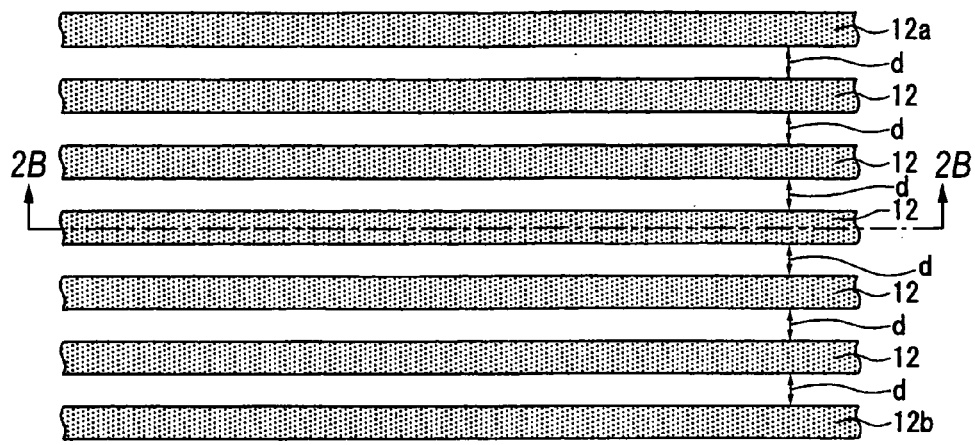
FIGS. 2A to 2D are fabrication process diagrams (No. 1) depicting a semiconductor device of a first embodiment.
Figure 2B:
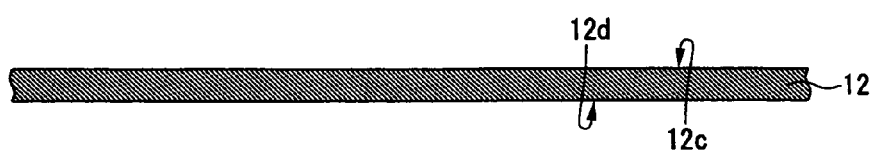
Figure 2C:
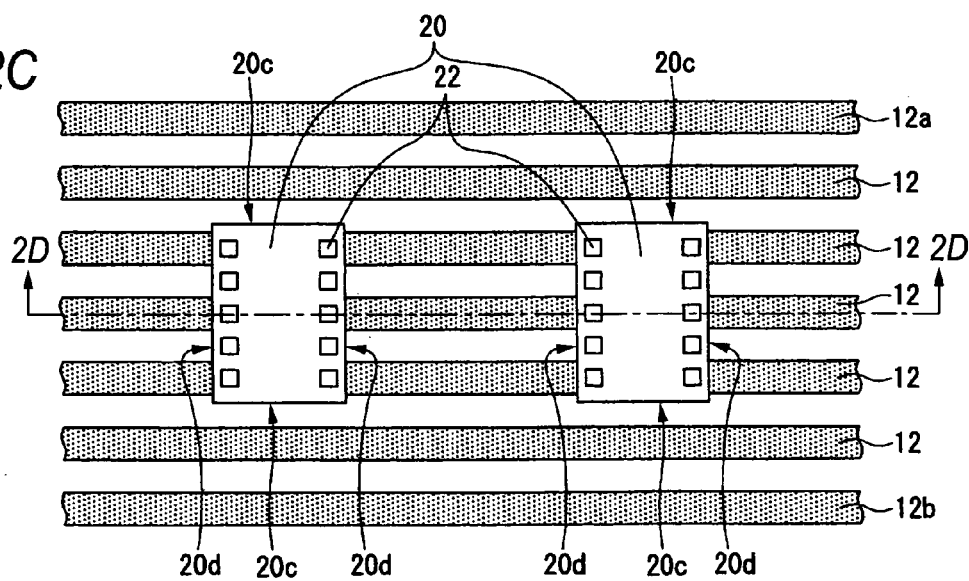
Figure 2D:
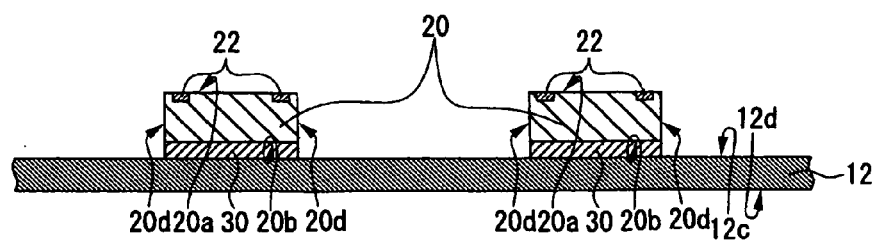

FIGS. 2A to 2D are explanatory diagrams (No. 1) for illustrating the fabrication process steps of the semiconductor device of the first embodiment. FIG. 2A is a schematic plan view illustrating the fabrication process step of the semiconductor device. FIG. 2B is a schematic diagram depicting a section cut by an alternate long and short dashed line indicated by 2B—2B shown in FIG. 2A. FIG. 2C is a schematic plan view illustrating the fabrication process step of the semiconductor device. FIG. 2D is a schematic diagram depicting a section cut by an alternate long and short dashed line indicated by 2D—2D shown in FIG. 2C.

Figure 3A:
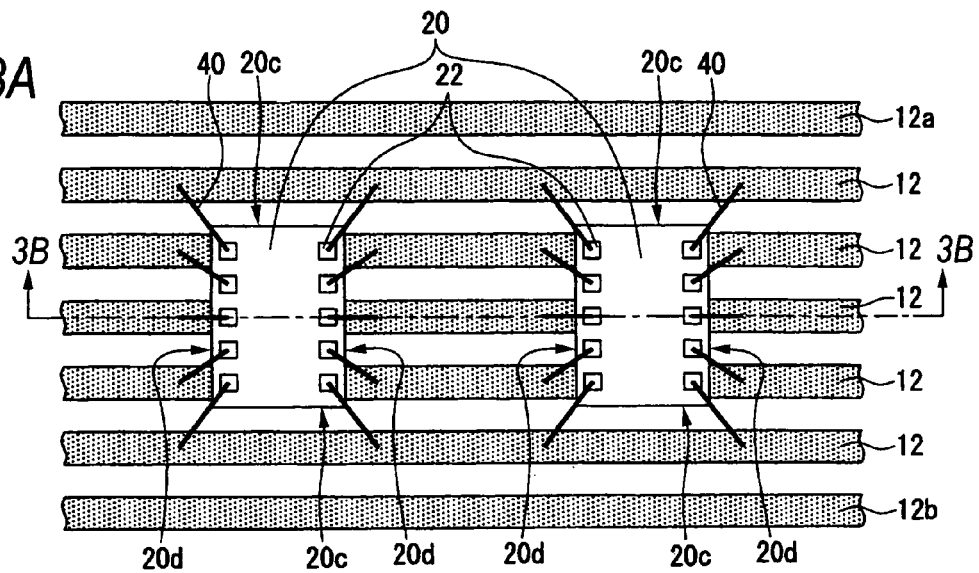
FIGS. 3A to 3D are fabrication process diagrams (No. 2) depicting the semiconductor device of the first embodiment.
Figure 3B:
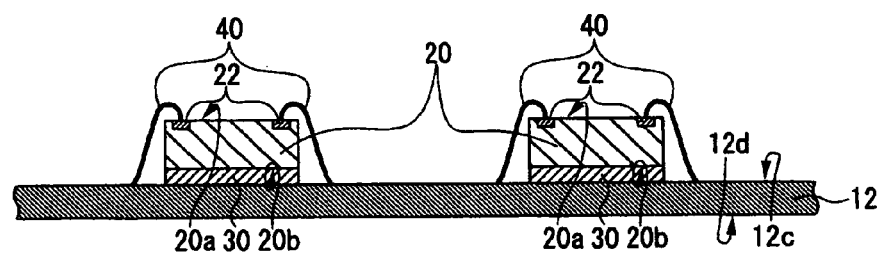
Figure 3C:
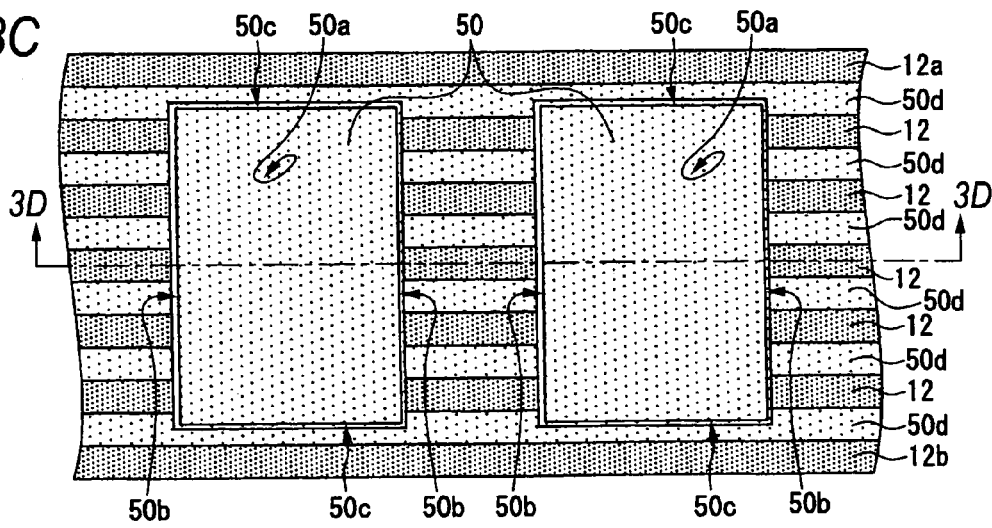
Figure 3D:
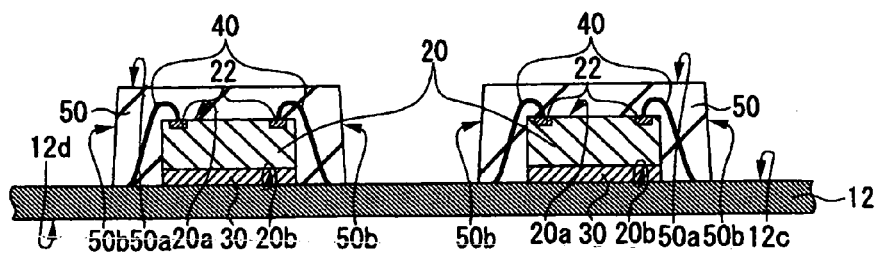

FIGS. 3A to 3D are explanatory diagrams (No. 2) depicting the fabrication process steps of the semiconductor device of the first embodiment. FIG. 3A is a schematic plan view for illustrating the fabrication process step of the semiconductor device. FIG. 3B is a schematic diagram depicting a section cut by an alternate long and short dashed line indicated by 3B—3B shown in FIG. 3A. FIG. 3C is a schematic plan view for illustrating fabrication process step of the semiconductor device. FIG. 3D is a schematic diagram depicting a section cut by an alternate long and short dashed line indicated by 3D—3D shown in FIG. 3C.

Figure 4A:
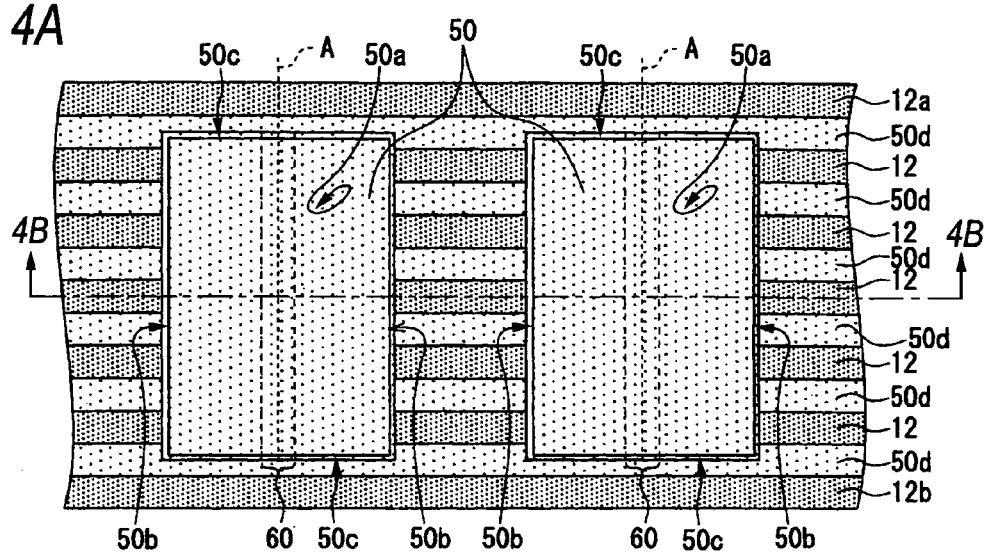
FIGS. 4A to 4C are fabrication process diagrams (No. 3) depicting the semiconductor device of the first embodiment.
Figure 4B:
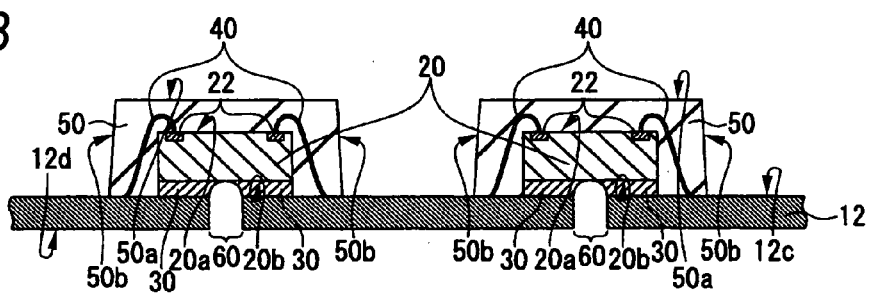
Figure 4C:
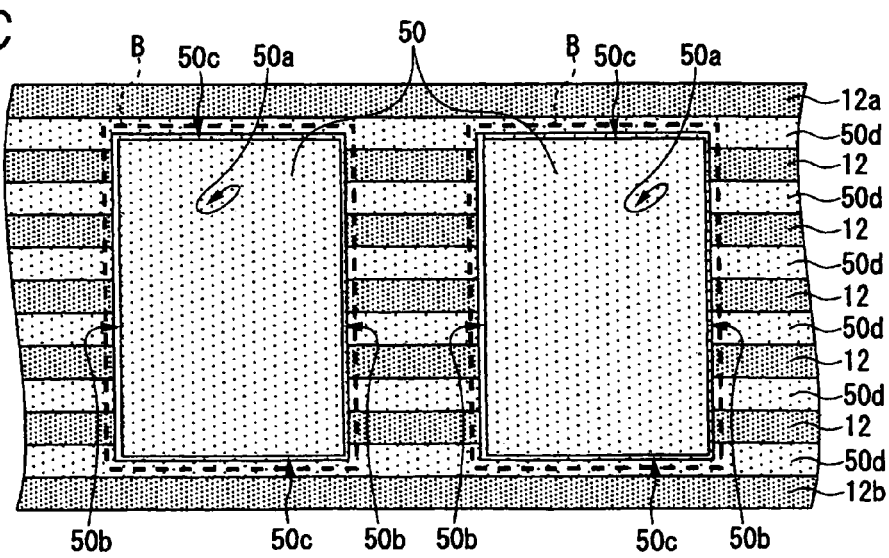

FIGS. 4A to 4C are explanatory diagrams (No. 3) depicting the fabrication process steps of the semiconductor device of the first embodiment. FIG. 4A is a schematic plan view for illustrating the fabrication process step of the semiconductor device. FIG. 4B is a schematic diagram depicting a section cut by an alternate long and short dashed line indicated by 4B—4B shown in FIG. 4A. FIG. 4C is a schematic plan view for illustrating the fabrication process step of the semiconductor device.

The leadframe 12 used for the fabrication method according to the invention has a long, linear shape. These leadframes 12 are preferably formed in bands (strips) of a conductive metal material such as copper or a copper alloy. The shorter length (width) is about 0.2 to 0.5 mm, in a typical standard example in the present semiconductor device.

As shown in FIG. 2A, a plurality of the leadframes 12 is separated in stripes at an equal interval d, and is extended and held between the two first and second reels 110a and 110b as described above.

The leadframe 12 functions as the external terminal of the semiconductor device to be fabricated. Therefore, the interval d between the plurality of the leadframes 12 disposed in parallel to each other is determined to be equal to the interval between the external terminals in accordance with the specifications of the semiconductor chip to be mounted on the leadframes 12 and the specifications of the semiconductor device to be fabricated, which will be described later. The interval between the external terminals corresponding to the interval d between the leadframes 12 is about 0.5 to 1.5 mm, in a typical standard example of the present semiconductor device.

Therefore, in this example, the example in which the plurality of leadframes 12 is arranged at an equal interval (spacing) d will be described, but it is easy to arrange the leadframes 12 at different intervals in accordance with the specifications of external terminals, for example.

As shown in FIG. 2A, among the plurality of the leadframes 12 arranged side by side, two leadframes 12 placed at the outermost positions are referred to as a first outermost leadframe 12a and a second outermost leadframe 12b, respectively.

As shown in FIG. 2B, one main surface of the leadframe 12 is a front side 12c, and the other main surface is a back side 12d. The front side 12c is also called a top surface, and the backside 12d is also called an under (or bottom) surface. Preferably, palladium is coated over throughout the surface including the top surface 12c and the under surface 12d beforehand by a plating process step according to traditional methods.

Subsequently, as shown in FIG. 2C, semiconductor chips 20 are arranged separately from each other in the longitudinal direction (long direction) of extension of the leadframes 12 so that each of the semiconductor chips 20 is placed over the plurality of the linear leadframes 12.

The semiconductor chip 20 generally has a substantially rectangular parallelepiped shape. Each semiconductor chip 20 has a first main surface 20a with a plurality of electrode pads 22, and has a second main surface 20b facing away from (opposite) the first main surface 20a. The first main surface 20a and the second main surface 20b of the semiconductor chip 20 are the same rectangular shape in this example. Furthermore, two end faces 20c and 20c facing away from (arranged opposite) other and two side faces 20d and 20d orthogonal to the end faces 20c and 20c and facing away from other are located between the first and second main surfaces.

Here, the number of leadframes 12 is seven and the number of semiconductor chips 20 to be mounted is two for purposes of description.

The semiconductor chip 20 is dice-bonded on the leadframes 12 so that the longitudinal direction of the rectangular shape of the first main surface 20a and the second main surface 20b is orthogonal to the direction of extension (the longitudinal direction) of the leadframes 12. In this case, the end faces 20c and 20c 6f the semiconductor chip 20 extend along the direction of extension the leadframes 12, and the semiconductor chip 20 is not mounted on the leadframes 12 adjacent to the first and second outermost leadframes 12a and 12b. More specifically, two each of the leadframes 12 including the first and second outermost leadframes 12a and 12b on the outside are exposed from (not covered by) the mounted semiconductor chip 20.

In mounting the semiconductor chip, the second main surface 20b of the semiconductor chip 20 is attached onto the top surfaces 12c of three leadframes 12 in the center through an insulating adhesive 30 (FIG. 2D).

As the insulating adhesive 30, traditionally well-known products can be preferably used freely. For the adhesive 30, insulating adhesive tapes, for example, are acceptable as well as paste adhesives.

The electrode pads 22 are disposed and exposed on the first main surface 20a. In this example, five each of the electrode pads 22 are arranged along each of two side faces 20d and 20d of the semiconductor chip 20 so that the electrode pads 22 along the same side faces are arranged (spaced apart) at equal intervals. Moreover, the electrode pads on each of the side faces 20d and 20d are arranged and spaced apart from each other at equal intervals.

As described above, the interval d between the plurality of leadframes 12 is equal to the interval between the external terminals of the semiconductor chips to be mounted on the leadframes 12 or the semiconductor device to be fabricated. The interval between the external terminals is determined in accordance with the specifications of the semiconductor chip 20 or the semiconductor device 10 to be fabricated.

Then, the electrode pads 22 are joined to five inside leadframes 12 with bonding wires 40 (FIGS. 3A and 3B). The bonding process step is freely conducted by preferable methods such as thermo compression bonding and ultrasonic thermo compression bonding with the use of traditionally well-known bonding wires and a bonding apparatus.

At this time, the configuration is such that the bonding wires 40 are not joined to the first and second outermost leadframes 12a and 12b. By doing this, it is easy to prevent an encapsulation resin material from leaking over the first and second outermost leadframes 12a and 12b in the encapsulation process step, which will be described later.

The bonding wires 40 are bonded to the leadframes 12 exposed around the semiconductor chip 20. In the exemplary configuration shown in the drawing, each pair of electrode pads 22 on a straight line along the direction of extension of a leadframe 12 is joined to the same leadframe 12 among the electrode pads 22 of the semiconductor chip 20.

Subsequently, as shown in FIGS. 3C and 3D, an encapsulation part 50 for encapsulating the semiconductor chip 20 and the bonding wires 40 is formed. The appearance of the structure where the encapsulation part 50 is formed is a substantially rectangular parallelepiped. The side faces around the rectangular parallelepiped are encapsulation part side faces 50b and 50b and encapsulation part end faces 50c and 50c.

The encapsulation part 50 can be freely formed by a traditionally well-known encapsulation process step with a mold, for example, with the use of proper materials such as traditionally well-known molding resins and liquid resins. In this example, the encapsulation process step can be conducted by using a traditionally well-known encapsulation apparatus with a mold capable of forming a cavity that can house a single semiconductor chip bonded on the leadframes 12, for example. More specifically, a cavity to house a single semiconductor chip is formed by an upper mold to surround a single semiconductor chip 20 as contacted with the top surfaces 12c of the leadframes 12 on which the semiconductor chip 20 is mounted, and a lower mold contacted with the under (bottom) surfaces 12d (both molds are not shown). Then, the encapsulation resin material is filled in the cavity and cured to form the encapsulation part 50.

Therefore, the encapsulation part 50 of the semiconductor device 10 of the embodiment is formed so as to package the semiconductor chip 20 one each.

By the encapsulation process step, the spaces between the plurality of linear leadframes are also buried (filled) with the encapsulation resin material to form interframe encapsulation parts 50d. However, at this time, the top surfaces 12c of the leadframes 12 outside the encapsulation part 50 are exposed.

After that, all the leadframes 12 right under the second main surface 20b of the semiconductor chip 20 are cut in the vertical (perpendicular) direction to the end faces 20c and 20c of the semiconductor device 20, that is, the direction along the side faces 20d and 20d. A groove part 60 is thus formed. This process step can be conducted by using a traditionally well-known dicing apparatus.

As shown in FIG. 4A, in this example, a dicing line A is set beforehand on the second main surface 20b (see FIG. 4B) along the direction orthogonal to the direction of extension of the leadframes 12. The dicing line A is a line passing through the center of the width of the second main-surface 20b along the direction orthogonal to the direction of extension of the leadframes 12. The dicing line A preferably divides the areas of the first and second main surfaces 20a and 20b and the end faces 20c and 20c into two equal sections.

As shown in FIG. 4B, the groove part 60 is formed along the dicing line A across at least the leadframes 12 on which the second main surface 20b of the semiconductor chip 20 is mounted for cutting them. At this time, the depth (height) of the groove part 60 is determined as the depth at which the leadframes 12 can be cut completely and the range at which the function of the semiconductor chip 20 is not impaired. Therefore, it is fine that the depth is set to expose the second main surface 20b of the semiconductor chip 20 at the maximum.

In the process step of cutting the leadframes 12 (the process step of forming the groove part 60), it is preferable to form the groove part 60 so as not to cut the first and second outermost leadframes 12a and 12b.

In doing this, since the encapsulation resin material is filled between the adjacent leadframes and continues to the outermost leadframes 12a and 12b, the strength of the entire structure of connecting the semiconductor devices in midstream of fabrication can be secured. Therefore, a plurality of the connected semiconductor devices in midstream of fabrication can be moved easily and sequentially after the completion of the process steps by the first and second outermost leadframes 12a and 12b that are not cut for implementing it in a series of the fabrication process steps, as conducted in the fabrication process of TCP, for example.

Figure 5A:
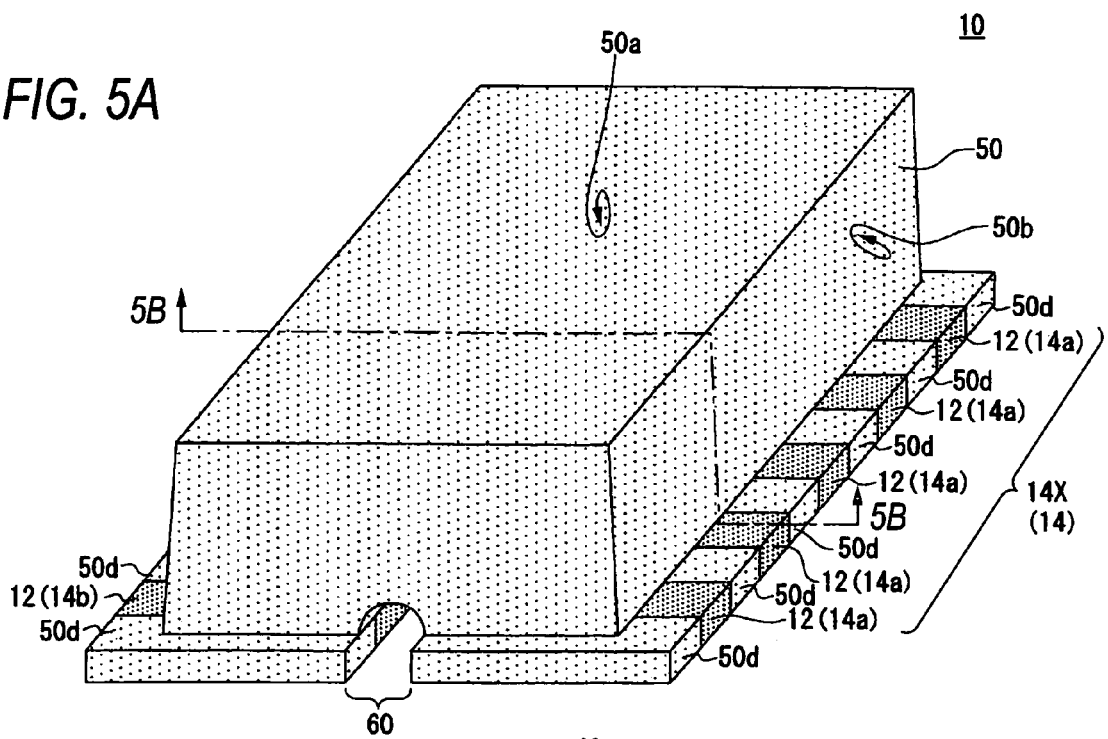
FIGS. 5A to 5C are schematic diagrams depicting the semiconductor device of the first embodiment.

After that, as shown in FIG. 4C, each of the semiconductor chips 20 is cut therearound to separate them into the individual semiconductor devices 10 including the semiconductor chip 20 (see, FIG. 5A). Also in the separation process step, the first and second outermost leadframes 12a and 12b are not cut.

The separation process step is conducted by pressing molds surrounding the area enclosed by a broken line B shown in FIG. 4C, such as upper and lower molds with the same shapes as those used in the encapsulation process step. Pressing the molds can cut both the plurality of leadframes 12 inside as well as the interframe encapsulation parts 50d filling the spaces between the leadframes 12.

The separation process step like this is conducted to obtain the semiconductor device 10.

In this manner, according to the fabrication method of the semiconductor device of the invention, since a plurality of the process steps can be conducted on the leadframes 12 continuously, the semiconductor devices in midstream of fabrication do not dwell (linger) until they are processed by the subsequent process step before. Accordingly, many semiconductor devices can be fabricated efficiently within a short time. Furthermore, it contributes to the reduction in the fabrication costs of the semiconductor device.

Semiconductor Device

The configuration of the semiconductor device fabricated by the fabrication method of the first embodiment described with reference to FIGS. 2A to 4C will be described with reference to FIGS. 5A, 5B and 5C.

FIG. 5A is a schematic perspective view for illustrating the exemplary configuration of the semiconductor device 10 of the first embodiment. FIG. 5B is a schematic diagram depicting a section of the semiconductor device 10 cut by an alternate long and short dashed line indicated by 5B—5B shown in FIG. 5A. FIG. 5C is a plan view depicting the semiconductor device 10 seen from the bottom (external terminal side).

In addition, in the description of the semiconductor device, selection of materials for each component is described already, thus omitting the detailed description.

The semiconductor device 10 fabricated by the fabrication method of the semiconductor device of the first embodiment includes the semiconductor chip 20. As described above, the semiconductor chip 20 has a nearly rectangular parallelepiped shape having the first main surface 20a, the second main surface 20b facing away from the first main surface 20a, and the end faces 20c and the side faces 20d between the first main surface 20a and the second main surface 20b. The plurality of the electrode pads 22 is exposed from the first main surface 20a. The plurality of the electrode pads 22 is arranged along the side faces 20d on the first main surface 20a (see FIG. 2C).

The semiconductor device 10 includes a plurality of external terminals 14. The external terminals 14 are disposed and attached on the second main surface 20b of the semiconductor chip 20 through the insulating adhesive 30. In this example, the external terminal 14 is formed of the leadframe 12 in a strip. As described above, the interframe encapsulation part 50d is disposed between the side faces of the leadframes 12.

Figure 5B:
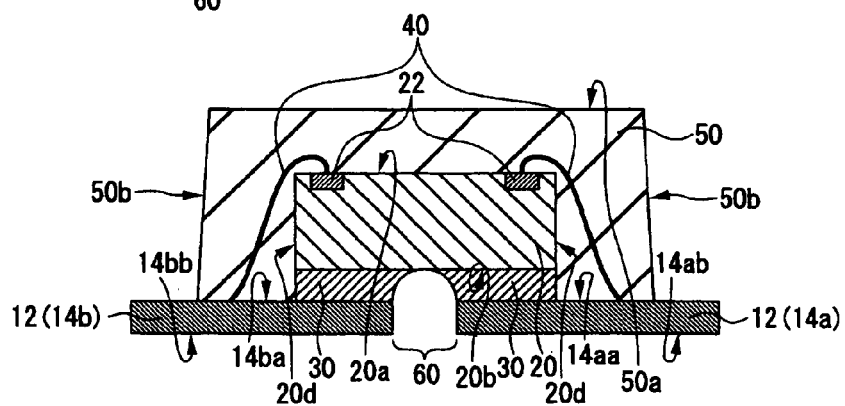
Figure 5C:
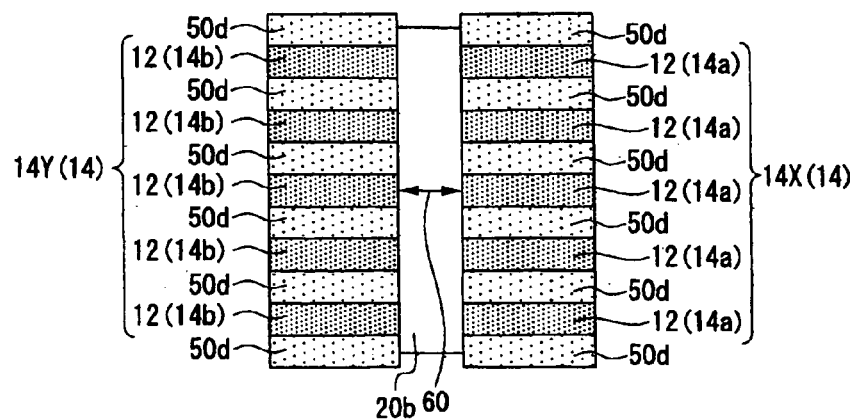

As shown in FIG. 5B, the external terminals 14 are disposed so as to be exposed from the outline of the semiconductor chip 20. More specifically, the external terminals 14 are disposed as a first external terminal row 14X including a plurality of first external terminals 14a. Similarly, a second external terminal row 14Y including a plurality of second external terminals 14b is also disposed on the other side face 20d. In this example, the first external terminal row 14X and the second external terminal row 14Y face (oppose) each other across a gap (groove 60) so as to sandwich the groove part 60 extending in the vertical direction to the end faces 20c and 20c.

The first and second external terminals 14a and 14b extend in an orthogonal direction with respect to the side faces 20d facing away from each other, respectively, and are arranged side by side a predetermined distance apart in a plane parallel to the second main surface 20b of the semiconductor chip 20 (that is, at equal intervals in this example).

The electrode pads 22 and the external terminals 14 are joined to each other with the bonding wires 40. In this example, the surfaces of the electrode pad 22 and the external terminal 14 (front sides 14aa and 14ba of the terminals) are joined in correspondence one for one.

he semiconductor device 10 has the encapsulation part 50 for encapsulating the semiconductor chip 20 and the bonding wires 40 and the interframe encapsulation parts 50d outside the encapsulation part 50. In this example, the encapsulation part 50 is disposed as a shape of a nearly rectangular parallelepiped placed on the first and second external terminal rows 14X and 14Y.

The interframe encapsulation parts 50d are disposed so as to fill the spaces between a plurality of the external terminals 14a and between the external terminals 14b as exposed outside the encapsulation part 50. However, the interframe encapsulation parts 50d are disposed so as to expose a part of the front sides 14aa and 14ba and back sides 14ab and 14bb of the external terminals 14a and 14b.

According to the semiconductor device of the first embodiment, since the external terminals 14 are disposed two-dimensionally as adjoining the second main surface 20b of the semiconductor chip 20, the semiconductor device can be formed in a lower profile, that is, in a smaller shape. Moreover, since the external terminals are exposed widely on the back side, heat generated by the semiconductor chip can be dissipated efficiently.

Second Embodiment 2-1. Fabrication Method of the Semiconductor Device

A fabrication method of a semiconductor device of a second embodiment according to the invention will be described with reference to FIGS. 6A to 6D. In addition, the differences between the fabrication method of the semiconductor device of the embodiment and the semiconductor device fabricated by the fabrication method and the first embodiment reside in the process step of forming an encapsulation part 50, the shape of the encapsulation part 50, and a separation process step. Thus, they will be described, and the drawings and detailed description of the same process steps and configurations as those in the first embodiment are omitted.

Figure 6A:
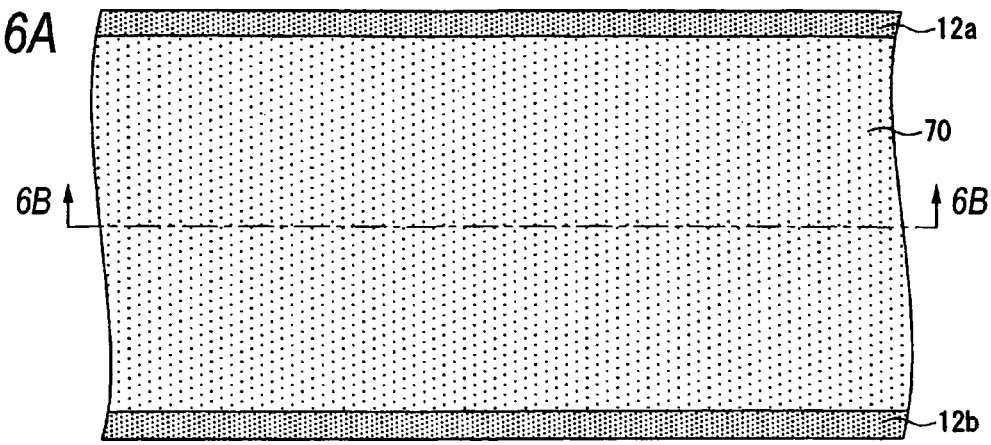
FIGS. 6A to 6D are fabrication process diagrams depicting a semiconductor device of a second embodiment.
Figure 6B:
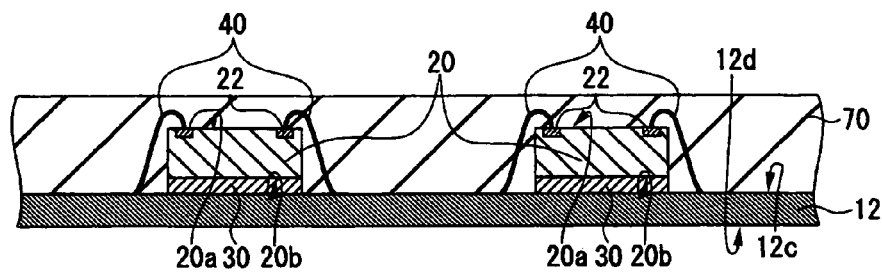
Figure 6C:
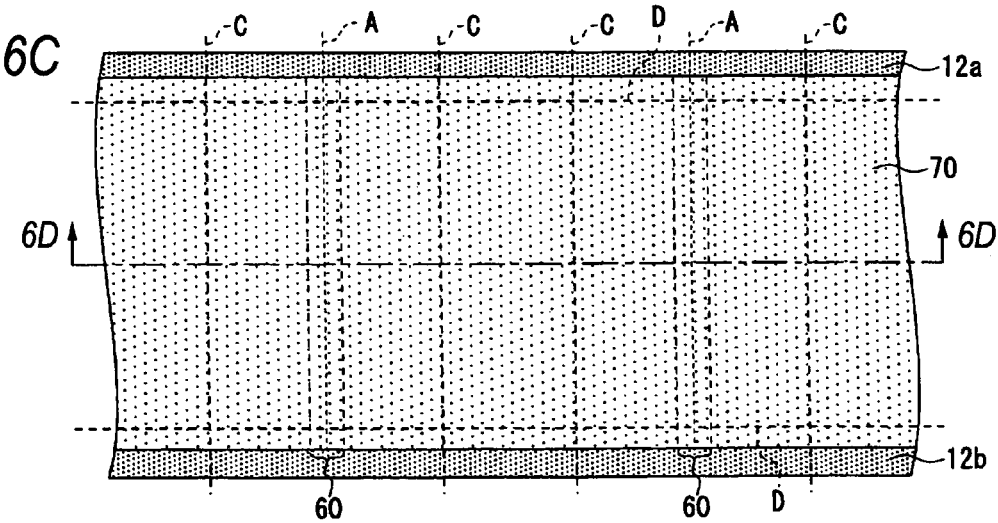
Figure 6D:
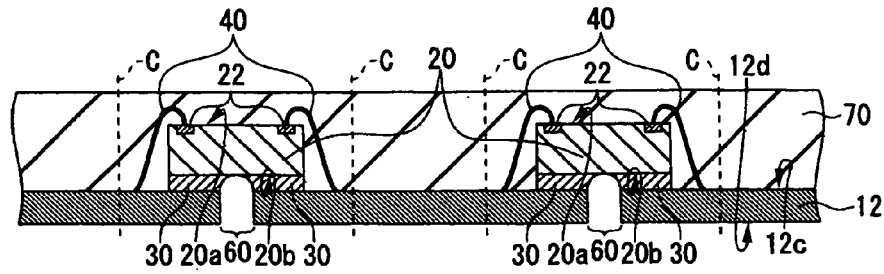

FIGS. 6A to 6D are explanatory diagrams depicting the fabrication process steps of the semiconductor device of the second embodiment. FIG. 6A is a schematic plan view for illustrating the fabrication process step of the semiconductor device, particularly the encapsulation process step. FIG. 6B is a schematic diagram depicting a section cut by an alternate long and short dashed line indicated by 6B—6B shown in FIG. 6A. FIG. 6C is a schematic plan view illustrating the fabrication process step of the semiconductor device, particularly the separation process step. FIG. 6D is a schematic diagram depicting a section cut by an alternate long and short dashed line indicated by 6D—6D shown in FIG. 6C.

In the fabrication method of the second embodiment, since a dice bonding process step, a wire bonding process step (FIGS. 2A to 3B), and an external terminal forming process step (FIGS. 4A and 4B) are the same as those in the first embodiment, see the description in the first embodiment.

As shown in FIGS. 6A and 6B, an encapsulation layer 70 for encapsulating a semiconductor chip 20 and bonding wires 40 joined to the semiconductor chip is formed.

The encapsulation layer 70 is formed so as to expose first and second outermost leadframes 12a and 12b on end faces 20c and 20c of the semiconductor chip 20 and to cover two or more of the semiconductor chips on side faces 20d and 20d of the semiconductor chip 20, a preferable number is set freely.

The encapsulation process step can be conducted by using the traditionally well-known encapsulation apparatus with the molds having the structure described on the first embodiment, other than forming a cavity that can house a plurality of the semiconductor chips bonded on leadframes 12, a preferable number is set freely.

As a matter of course, the spaces between the plurality of linear leadframes are filled with the encapsulation resin material by the encapsulation process step.

Subsequently, all the leadframes 12 placed right under the second main surface 20b of the semiconductor chip 20 are cut at a scribe line A (see FIG. 6C) to form a groove part 60 similar to the first embodiment.

After that, as shown in FIGS. 6C and 6D, the semiconductor device 10 including the semiconductor chip 20 is separated into each piece (see FIGS. 6A to 6D) in which the encapsulation layer 70 and the leadframes 12 are cut along scribe lines C extending in the direction orthogonal to the first and second outermost leadframes 12a and 12b and set in the space between the semiconductor chips 20, and scribe lines D extending in the direction along the first and second outermost leadframes 12a and 12b. The difference between the configuration of the semiconductor device 10 thus obtained and that of the semiconductor device described in the first embodiment is in that the semiconductor device of the second embodiment itself has substantially a nearly rectangular parallelepiped shape and has no projecting external terminals.

For the separation process step, for example, the traditionally well-known dicing apparatus similar to that used in forming the groove part 60 can be used.

According to the fabrication method of the semiconductor device of the second embodiment, in addition to the advantages obtained by the fabrication method of the first embodiment, the process step of forming the groove part 60 and the separation process step can be conducted by using the same apparatus. Furthermore, the separation process step can be made simpler. Therefore, the semiconductor device can be fabricated more efficiently.

2-2. Semiconductor Device

The configuration of the semiconductor device fabricated by the fabrication method of the second embodiment will be described with reference to FIGS. 7A, 7B and 7C.

Figure 7A:
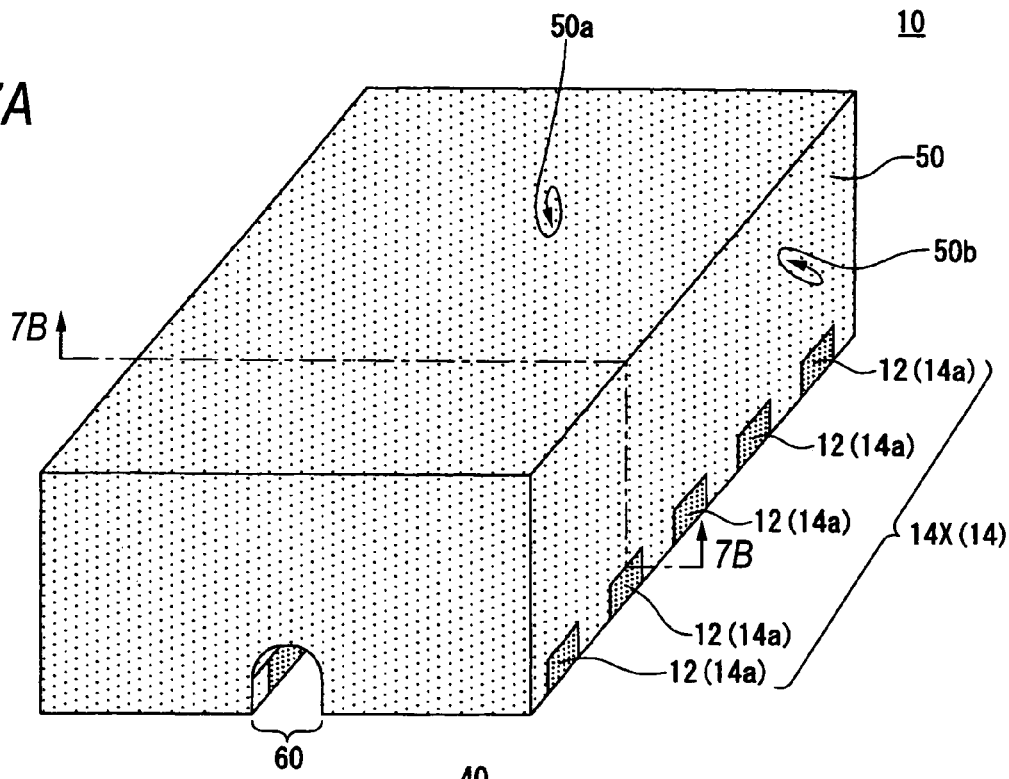
FIGS. 7A to 7C are schematic diagrams depicting the semiconductor device of the second embodiment.

FIG. 7A is a schematic perspective view for illustrating the exemplary configuration of the semiconductor device 10 of the second embodiment 10. FIG. 7B is a schematic diagram depicting a section of the semiconductor device 10 cut by an alternate long and short dashed line indicated by 7B—7B shown in FIG. 7A. FIG. 7C is a plan view depicting the semiconductor device 10 seen from the bottom (external terminal side).

In addition, the encapsulation part having the configuration different from that of the semiconductor device of the first embodiment will be described here, and the detailed description of the same configuration as that of the first embodiment is omitted.

Figure 7B:
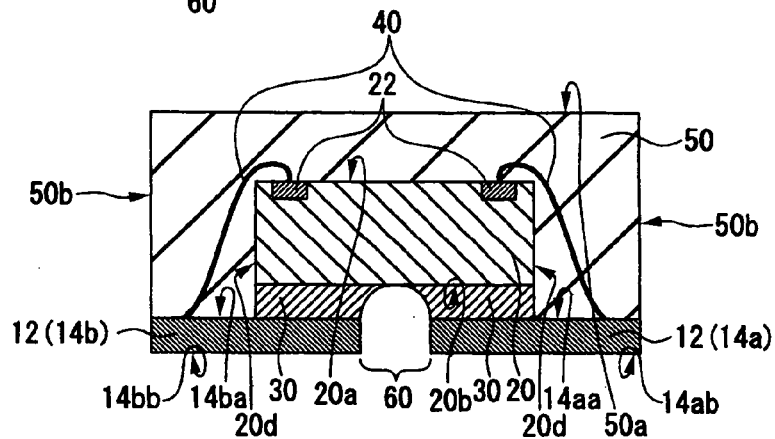

As shown in FIGS. 7A and 7B, the encapsulation part 50 is formed to have a nearly rectangular parallelepiped shape. The encapsulation part 50 encapsulates the semiconductor chip 20, the bonding wires 40 and the external terminals 14. The external terminals 14 (that is, the first and second external terminals 14a and 14b) are disposed so that the sections generated by the separation process step are exposed from both encapsulation part side faces 50b and 50b, respectively.

Figure 7C:
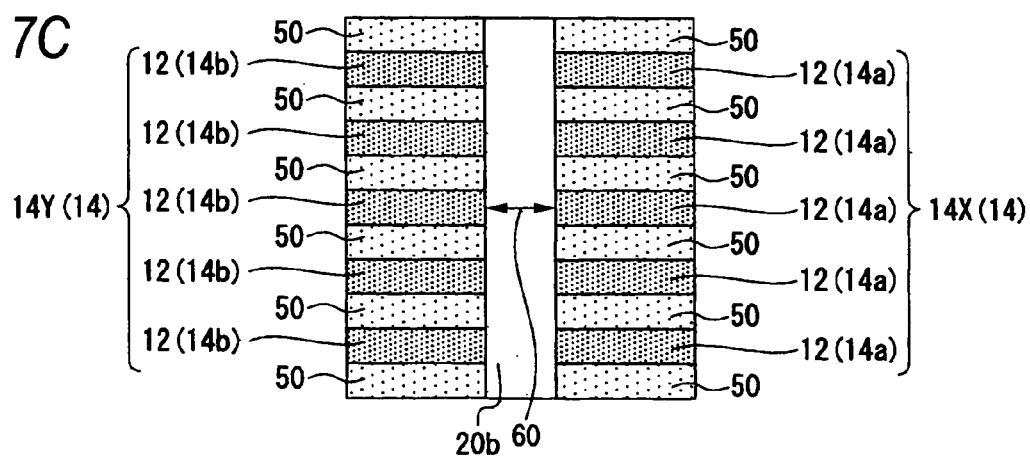

Moreover, as shown in FIGS. 7B and 7C, the encapsulation part 50 is disposed so as to expose back sides 14ab and 14bb thereof.

According to the semiconductor device of the second embodiment, in addition to the advantages obtained by the semiconductor device of the first embodiment, the semiconductor device can be formed even smaller because the external terminals 14 are not projected from the encapsulation part 50.

What is claimed is:

1. A method of fabricating a semiconductor device, comprising:
    arranging a plurality of elongated leadframes side by side and separate from each other;
    mounting a plurality of semiconductor chips on the plurality of leadframes so that the semiconductor chips are spaced apart from each other along a direction of elongation of the leadframes, each of the semiconductor chips having a first main surface and a second main surface opposite the first main surface, each of the semiconductor chips having a plurality of electrode pads on the first main surface thereof, the semiconductor chips being mounted so that the second main surface of each of the semiconductor chips faces the leadframes;
    joining the plurality of electrode pads on the first main surface of each of the semiconductor chips to the plurality of leadframes via bonding wires;
    separately encapsulating each of the semiconductor chips and the bonding wires so as to form main encapsulation parts;
    filling a space between adjacent leadframes exposed outside of the main encapsulation parts so as to form interframe encapsulation parts;
    forming grooves by cutting all of the leadframes directly under the second main surface of each of the semiconductor chips in a direction orthogonal to the direction of elongation of the leadframes; and
    cutting the leadframes and the interframe encapsulation parts exposed between the main encapsulation parts so as to form a plurality of semiconductor devices each having a first external terminal row formed of the cut leadframes, a second external terminal row formed of the cut leadframes and facing the first external terminal row so as to sandwich one of the grooves therebetween, and one of the semiconductor chips mounted on the first external terminal row and the second external terminal row.

2. The method of claim 1, wherein said mounting of the plurality of semiconductor chips comprises mounting the semiconductor chips so as to maintain exposed outermost leadframes on each end of each of the semiconductors, said joining does not including joining bonding wires to the exposed outermost leadframes.

3. The method of claim 1, wherein said mounting comprises mounting the semiconductor chips directly on the leadframes so that the second main surface of each of the semiconductor chips is directly attached to the leadframes via adhesive.

4. A method of fabricating a semiconductor device, comprising:
    arranging a plurality of elongated leadframes side by side and separate from each other;
    mounting a plurality of semiconductor chips on the plurality of leadframes so that the semiconductor chips are spaced apart from each other along a direction of elongation of the leadframes, each of the semiconductor chips having a first main surface and a second main surface opposite the first main surface, each of the semiconductor chips having a plurality of electrode pads on the first main surface thereof, the semiconductor chips being mounted so that the second main surface of each of the semiconductor chips faces the leadframes;
    joining the plurality of electrode pads on the first main surface of each of the semiconductor chips to the plurality of leadframes via bonding wires;
    encapsulating the semiconductor chips and the bonding wires so as to form an encapsulation layer including the semiconductor chips and the bonding wires;
    forming grooves by cutting all of the leadframes directly under the second main surface of each of the semiconductor chips in a direction orthogonal to the direction of elongation of the leadframes; and
    cutting the leadframes and the encapsulation layer between the semiconductor chips within the encapsulation layer so as to form a plurality of semiconductor devices each having a first external terminal row formed of the cut leadframes, a second external terminal row formed of the cut leadframes and facing the first external terminal row so as to sandwich one of the grooves therebetween, and one of the semiconductor chips mounted on the first external terminal row and the second external terminal row.

5. The method of claim 4, wherein said mounting of the plurality of semiconductor chips comprises mounting the semiconductor chips so as to maintain exposed outermost leadframes on each end of each of the semiconductors, said joining does not including joining bonding wires to the exposed outermost leadframes.

6. The method of claim 4, wherein said mounting comprises mounting the semiconductor chips directly on the leadframes so that the second main surface of each of the semiconductor chips is directly attached to the leadframes via adhesive.

7. A semiconductor device comprising:
    a plurality of first external terminals spaced apart from each other;
    a plurality of second external terminals spaced apart from each other, said plurality of first external terminals and said plurality of second external terminals being arranged so as to be spaced apart and oppose each other across a gap;
    a semiconductor chip having a first main surface and a second main surface opposite said first main surface, said first main surface having a plurality of electrode pads mounted thereon, said semiconductor chip being mounted on said plurality of first external terminals and said plurality of second external terminals so that said second main surface of said semiconductor chip faces said plurality of first external terminals and said plurality of second external terminals;
    a plurality of bonding wires joining said plurality of electrodes on said first main surface of said semiconductor chip to said first external terminals and said second external terminals;
    a main encapsulation part encapsulating said semiconductor chip and said bonding wires; and
    a frame encapsulation part filling an area between each of said first external terminals and filling an area between each of said second external terminals.

8. The semiconductor device of claim 7, wherein said main encapsulation part and said frame encapsulation part are formed as a single integral component.

9. The semiconductor device of claim 7, wherein said plurality of first external terminals are spaced apart from each other so as to form a stripe pattern.

10. The semiconductor device of claim 7, wherein said semiconductor chip is directly mounted on said plurality of first external terminals and said plurality of second external terminals so that said second main surface of said semiconductor chip is directly attached to each of said plurality of first external terminals and each of said plurality of second external terminals via adhesive.

* * * * *